(12) United States Patent
Lee et al.

(10) Patent No.: US 12,476,171 B2
(45) Date of Patent: *Nov. 18, 2025

(54) LAND STRUCTURE FOR SEMICONDUCTOR PACKAGE AND METHOD THEREFOR

(71) Applicant: Amkor Technology Singapore Holding Pte. Ltd., Valley Point (SG)

(72) Inventors: Kyoung Yeon Lee, Gyeonggi-do (KR); Byong Jin Kim, Gyeonggi-do (KR); Jae Min Bae, Seoul (KR); Hyung Il Jeon, Gyeonggi-do (KR); Gi Jeong Kim, Gyeonggi-do (KR); Ji Young Chung, Gyeonggi-do (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 18/444,651

(22) Filed: Feb. 17, 2024

(65) Prior Publication Data

US 2024/0194572 A1    Jun. 13, 2024

Related U.S. Application Data

(60) Continuation of application No. 17/233,778, filed on Apr. 19, 2021, now Pat. No. 11,908,779, which is a
(Continued)

(30) Foreign Application Priority Data

Nov. 9, 2012 (KR) .......................... 10-2012-0126438

(51) Int. Cl.
*H01L 23/495* (2006.01)
*H01L 21/48* (2006.01)
(Continued)

(52) U.S. Cl.
CPC .... *H01L 23/49548* (2013.01); *H01L 21/4828* (2013.01); *H01L 21/565* (2013.01);
(Continued)

(58) Field of Classification Search
CPC ....... H01L 2021/6022; H01L 223/4951; H01L 23/49503; H01L 2224/48247;
(Continued)

(56) References Cited

U.S. PATENT DOCUMENTS 5,976,912 A    11/1999 Fukutomi et al.
6,031,291 A    2/2000 Sato et al.
(Continued)

FOREIGN PATENT DOCUMENTS

KR    10-1999-0069507    9/1999
KR    10-2012-0010044    2/2012

OTHER PUBLICATIONS

Office Action received from Korean Patent Office in Korean; English Translation Not Available; Date: Dec. 12, 2013; 5 pages.
(Continued)

*Primary Examiner* — Thanhha S Pham
(74) *Attorney, Agent, or Firm* — Kevin B. Jackson

(57) ABSTRACT

A semiconductor package structure includes a substrate comprising a land structure. The land structure includes a first land section having a first height in a cross-sectional view and a second land section having a second height in the cross-sectional view that is different than the first height. A mold encapsulant is disposed adjacent a lateral portion of the first land section and is disposed below a bottom portion of the second land section. A semiconductor die is attached to the substrate, and includes a first major surface, a second major surface opposing the first major surface, and an outer perimeter. The semiconductor die further includes a bonding structure disposed adjacent the first major surface, which is
(Continued)

coupled to the second land section such that the first land section is disposed outside the perimeter of the semiconductor die A mold member encapsulates at least portions of the semiconductor die.

15 Claims, 9 Drawing Sheets

Related U.S. Application Data division of application No. 15/823,737, filed on Nov. 28, 2017, now Pat. No. 11,018,079, which is a division of application No. 15/043,572, filed on Feb. 14, 2016, now Pat. No. 9,911,685, which is a division of application No. 14/072,845, filed on Nov. 6, 2013, now Pat. No. 9,293,398.

(51) Int. Cl.
*H01L 21/56* (2006.01)
*H01L 23/31* (2006.01)
*H01L 23/498* (2006.01)
*H01L 21/60* (2006.01)
*H01L 23/00* (2006.01)

(52) U.S. Cl.
CPC .... *H01L 23/3121* (2013.01); *H01L 23/49861* (2013.01); *H01L 2021/60007* (2013.01); *H01L 24/13* (2013.01); *H01L 24/16* (2013.01); *H01L 24/48* (2013.01); *H01L 2224/13101* (2013.01); *H01L 2224/16245* (2013.01); *H01L 2224/45099* (2013.01); *H01L 2224/48091* (2013.01); *H01L 2224/48247* (2013.01); *H01L 2924/00014* (2013.01); *H01L 2924/0002* (2013.01); *H01L 2924/181* (2013.01)

(58) Field of Classification Search
CPC ... H01L 2224/4851; H01L 2924/00014; H01L 23/49861; H01L 23/49548; H01L 23/3121; H01L 21/565; H01L 23/4951
See application file for complete search history.

(56) References Cited

U.S. PATENT DOCUMENTS

| | | |
|---|---|---|
| 6,255,740 B1 | 7/2001 | Tsuji et al. |
| 6,306,685 B1 | 10/2001 | Liu et al. |
| 6,351,025 B1 | 2/2002 | Ohsawa et al. |
| 6,384,472 B1 | 5/2002 | Huang et al. |
| 6,451,627 B1 | 9/2002 | Coffman |
| 6,476,469 B2 | 11/2002 | Hung et al. |
| 7,102,214 B1 | 9/2006 | Miks et al. |
| 7,153,724 B1 | 12/2006 | Sirinorakul et al. |
| 7,247,938 B2 | 7/2007 | Groenhuis |
| 7,476,972 B2 | 1/2009 | Takahashi |
| 8,551,820 B1 | 10/2013 | Foster |
| 11,018,079 B2 | 5/2021 | Lee |
| 2005/0260796 A1 | 11/2005 | Takahashi |
| 2007/0093000 A1 | 4/2007 | Shim et al. |
| 2007/0215996 A1 | 9/2007 | Otremba |
| 2008/0211068 A1* | 9/2008 | Chen ............ H01L 24/14 257/E23.036 |
| 2009/0034225 A1 | 2/2009 | Shoji |
| 2010/0258925 A1 | 10/2010 | Jeon |
| 2012/0061822 A1 | 3/2012 | Pagaila |
| 2012/0146199 A1 | 6/2012 | McMillan et al. |

OTHER PUBLICATIONS

Decision of Rejection received from Korean Patent Office in Korean; English Translation Not Available; Date: Aug. 29, 2014; 3 pages.

* cited by examiner

LAND STRUCTURE FOR SEMICONDUCTOR PACKAGE AND METHOD THEREFOR

CROSS REFERENCE TO RELATED APPLICATIONS

The present application is a continuation application of co-pending U.S. patent application Ser. No. 17/233,778 filed on Apr. 19, 2021 and issued as U.S. Pat. No. 11,908,779 on Feb. 20, 2024, which is a divisional application of U.S. patent application Ser. No. 15/823,737 filed on Nov. 28, 2017 and issued as U.S. Pat. No. 11,018,079 on May 25, 2021, which is a divisional application of U.S. patent application Ser. No. 15/043,572 filed on Feb. 14, 2016 and issued as U.S. Pat. No. 9,911,685 on Mar. 6, 2018, which is a divisional application of U.S. patent application Ser. No. 14/072,845 filed on Nov. 6, 2013 and issued as U.S. Pat. No. 9,293,398 on Mar. 22, 2016, which claims priority to Korean Patent Application No. 10-2012-0126438 filed on Nov. 9, 2012, all of which are expressly incorporated by reference herein, and priority thereto is hereby claimed.

BACKGROUND

The present invention relates to electronic devices and, more specifically, to electronic device package structures and methods of fabricating the same.

Electronic devices, such as semiconductor dies, are conventionally enclosed in plastic packages that protect the semiconductor die from hostile environments and that enable electrical interconnection between the semiconductor die and a next level of assembly, such as a printed circuit board (PCB) or motherboard. The elements of a typical electronic package include a conductive leadframe or substrate, an integrated circuit or semiconductor die, conductive structures, such as bond wires or solder balls that electrically connect pads on the semiconductor die to individual leads of the leadframe or substrate; and a hard plastic encapsulant material that covers the other components and forms an exterior of the semiconductor package commonly referred to as the package body. Portions of the individual leads can be exposed for use in electrically connecting the package to the next level assembly.

Consumer electronics devices are continually getting smaller and, with advances in technology, are gaining ever increasing performance and functionality. This is clearly evident in the technology used in consumer electronic products such as smart phones, laptop computers, tablet devices, wearable devices, as well as other electronic devices. Requirements of the smart phone industry, for example, are driving semiconductor packaged components to become smaller with higher functionality and reduced cost. A micro lead frame (MLF) type semiconductor package is one semiconductor package that is capable of realizing such a reduction.

In general, an MLF type semiconductor package is fabricated by forming a lead frame having an adhesion pad and at least one land physically isolated from each other with a resin layer, adhering a semiconductor die to the adhesion pad, connecting the chip pad of the semiconductor die and the land using a conductive wire, and then encapsulating the semiconductor die and the conductive wire with a molding member. Such a process is described in Korean Patent Laid-Open Publication No. 2009-0069884 (published on Jul. 1, 2009).

One problem with prior MLF type semiconductor packages is that the lands became dislodged from the bottom surface of the package during either the manufacturing of the package or subsequently during attachment of the package to a next level of assembly, such as a PCB. This greatly reduced the reliability of MLF type semiconductor packages.

Accordingly, it is desirable to have a structure and method that improve the reliability and functionality of small scale electronic packages such as MLF type semiconductor packages.

For simplicity and clarity of the illustration, elements in the figures are not necessarily drawn to scale, and the same reference numbers in different figures can denote the same elements. Additionally, descriptions and details of well-known steps and elements are omitted for simplicity of the description.

DETAILED DESCRIPTION OF THE DRAWINGS

The aspects of the present invention and methods for achieving the aspects will be apparent by referring to the embodiments to be described herein with reference to the accompanying drawings. It is understood that the embodiments described herein are illustrative only and that the present invention is not limited thereto, but can be implemented in alternative forms.

In accordance with the present embodiments, a substrate for an electronic package includes a land structure and an adhesion pad. The land structure and the adhesion pad are isolated from each other using, for example, an insulating layer. In one embodiment, the insulating layer can be a resin material. In another embodiment, the insulating layer can be multiple layers of materials, which can be the same materials or different materials. An electronic device, such as a semiconductor chip, can be attached to the adhesion pad and electrically connected to the land structure. In one embodiment, the electronic device and portions of the substrate are encapsulated with a mold body.

In accordance with the present embodiments, the land structure includes lands with a first portion having a relatively greater size than a second portion. In one embodiment, the first portion is proximate to an upper surface of the substrate. In another embodiment, the first portion is proximate to a middle portion of the substrate. In a further embodiment, the first and second portions can have the same shape. In a still further embodiment, the first and second portions can have different shapes. In accordance with one embodiment, the adhesion pad includes a first portion having a relatively greater size than a second portion. In one embodiment, the first portion of the adhesion pad is proximate to an upper surface of the substrate. In one embodiment, the first portion of the adhesion pad is proximate to a substantially centrally located portion of the substrate. In a further embodiment, the first and second portions of the adhesion pad can have the same shape. In a still further embodiment, the first and second portions of the adhesion portion can have different shapes. The resultant package structure provides, among other things, improved locking features and overcomes other disadvantages of prior structures and methods. It is understood that the features of the various embodiments described herein can be combined with each other, unless specifically noted otherwise.

Figure 1A:
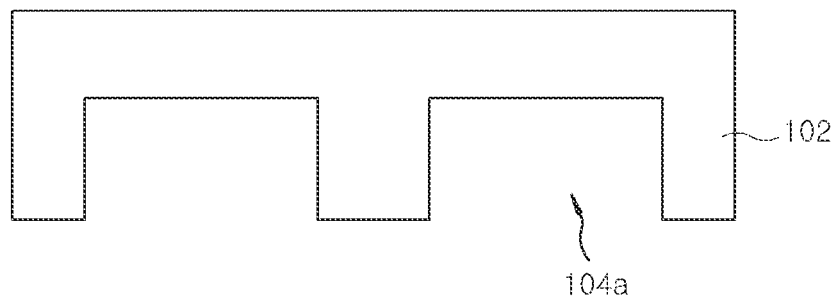
FIGS. 1A to 1J illustrate cross-sectional views of an electronic package at various stages of fabrication in accordance with an embodiment of the present invention.

FIGS. 1A to 1F illustrate cross-sectional views of an electronic package at various stages of fabrication in accordance with a first embodiment. In one embodiment, the electronic package is configured as an MLF type semiconductor package. In FIG. 1A, a portion of a lead frame or substrate 102 is selectively removed by performing a half-etching process using, for example, photoresist patterns (not shown) as an etch barrier or protective layer, to form holes or cavities 104a extending inward from a bottom surface or lower surface of lead frame 102. In the present embodiment, cavities 104a are configured to physically isolate an adhesion pad and lands (to be formed through subsequent processes) from each other. In one embodiment, lead frame 102 can be made of a conductive material, such as copper (Cu), aluminum (Al), alloys thereof, plated materials, combinations thereof, or other materials known to those of ordinary skill in the art.

Figure 1B:
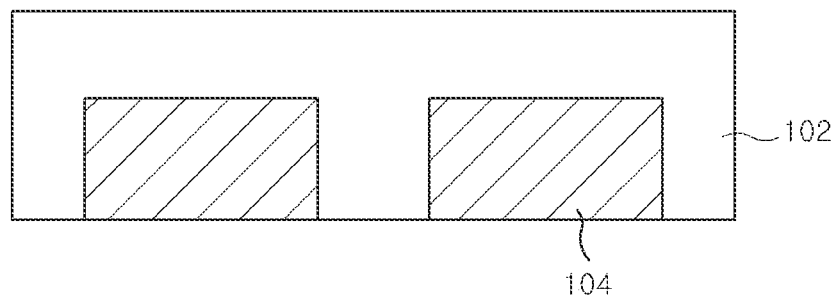

FIG. 1B illustrates the electronic package after additional processing. For example, the remaining photoresist patterns can be removed (or stripped), and a filling process is then performed so that cavities 104a are filled with an insulating material. In one embodiment, the insulating material can be one or more resin materials, such as an epoxy mold compound (EMC), thereby forming resin layers 104 in cavities 104a. In one embodiment, resin layer 104 can be formed by over-filling cavities 104a with the resin material such that the resin material overlaps onto the surface of lead frame 102 adjoining cavities 104a, and then removing excess resin material outside of cavities 104a through a grinding process or an etch-back process until the bottom of the lead frame is exposed proximate to cavities 104a. In one embodiment, portions of lead frame 102 may also be removed or portions lead frame 102 can act as a stop layer. In one embodiment, resin layer 104 is substantially co-planar with the bottom surface of lead frame 102 as generally illustrated in FIG. 1B.

Figure 1C:
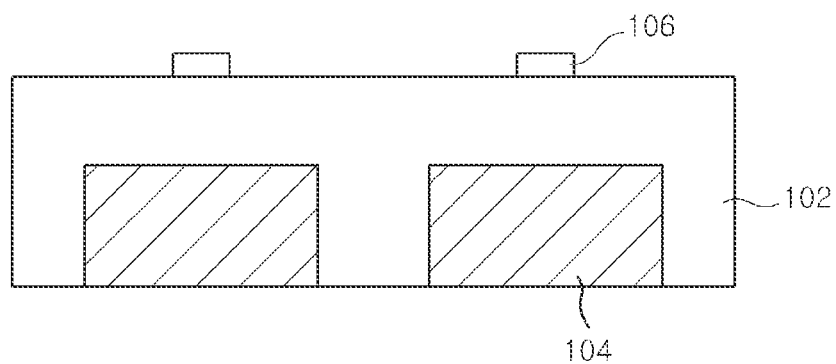

FIG. 1C illustrates the electronic package after more processing. For example, photoresist patterns 106 are formed at desired or predetermined locations (that is, top regions on lead frame 102, each pattern 106 for physically isolating an adhesion pad and lands to be formed through subsequent processes from each other) on the top surface or upper surface of lead frame 102 by coating a photoresist or masking material on lead frame 102, and then performing exposure and development processes.

Figure 1D:
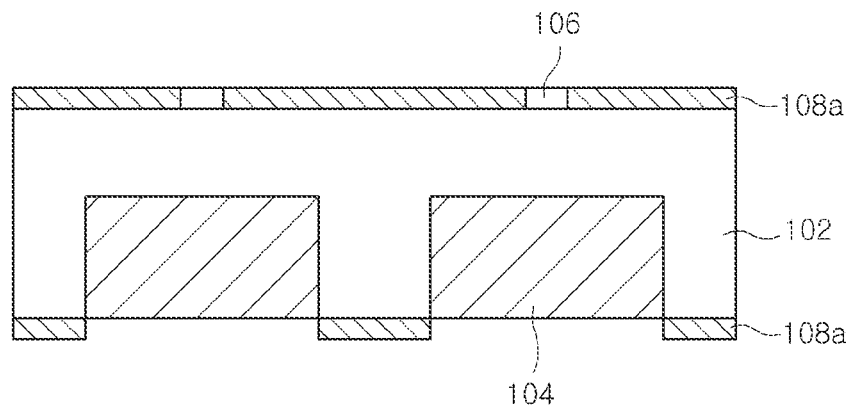
Figure 1E:
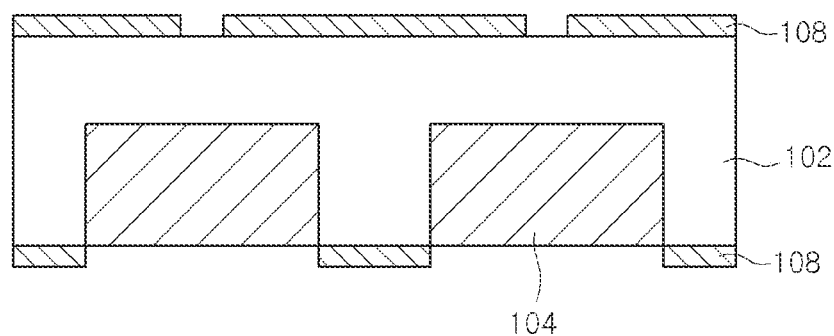

FIG. 1D illustrates the electronic package after further processing. For example, plating materials or conductive materials 108a can be formed on the top and bottom of lead frame 102 by performing, for example, a plating process using photoresist patterns 106 formed on the top surface lead frame 102 as plating-shield or protective layers. For example, as illustrated in FIG. 1E, plating layers 108 can be formed on the top and bottom of lead frame 102 by removing (or stripping) the remaining photoresist patterns 106 before the plating process is done.

Figure 1F:
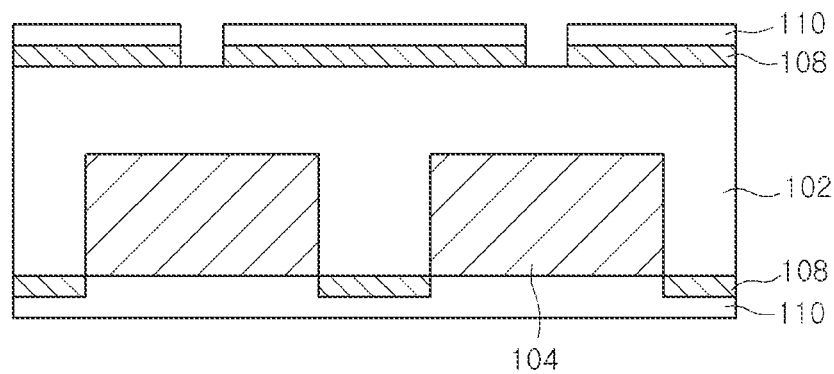

FIG. 1F illustrates the electronic package after still further processing. For example, masking layers such as photoresist patterns 110 are formed on exposed surfaces of the plating layers 108 and surfaces of the resin layers 104 by coating photoresist materials on both surfaces of lead frame 102 and then performing exposure and development processes. In the present embodiment, photoresist patterns 110 define openings on the top surface of lead frame 102 to expose portions of lead frame 102 for physically isolating an adhesion pad and lands to be formed through subsequent processes.

Figure 1G:
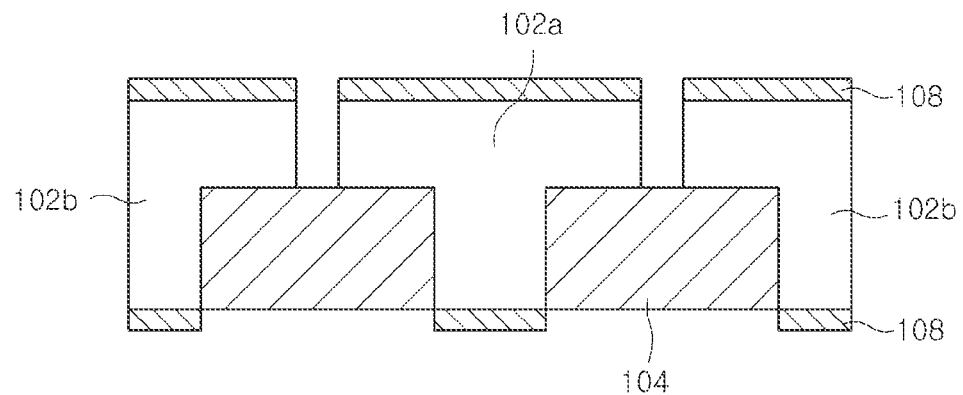

The exposed top regions of lead frame 102 can then be removed by performing an etch process or half-etch process using photoresist patterns 110 as etch barrier layers. This step can form an opening or cavity extending inward from the top regions of lead frame 102. In one embodiment, the etch process continues until part of the top surface of resin layer 104 is exposed in the opening formed. For example, as illustrated in FIG. 1G, the etching process forms lands 102b, each having the size of the upper part relatively larger than the size of the lower part, and an adhesion pad 102a (also having the size of the upper part relatively larger than the size of the lower part thereof) to which an electronic chip, such as a semiconductor die, can be attached. In a subsequent step, the remaining photoresist patterns can be removed.

In accordance with the present embodiment and illustrated in FIG. 1G, a plurality of land structures 102b (or lands), which are physically isolated from each other and from adhesion pad 102a, and each configured to have the size of the upper part relatively larger than the size of the lower part, can be formed in the lead frame by performing a series of the processes as set forth hereinbefore. The structures of the upper part and the lower part of land structures 102b manufactured according to the present embodiment can have various shapes such as rectangular shapes or circular shapes. In another embodiment, the upper part of land structures 102b can be a rectangular shape and the lower part thereof can be a circular shape. In a further embodiment, the upper part of land structure 102b can be a circular shape and the lower part thereof can be a rectangular shape.

Figure 2A:
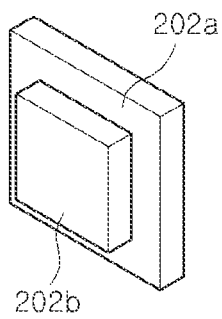
FIGS. 2A to 2F illustrate perspective views of land structures having various shapes that can be used in an electronic package in accordance with an embodiment the present invention.
Figure 2B:
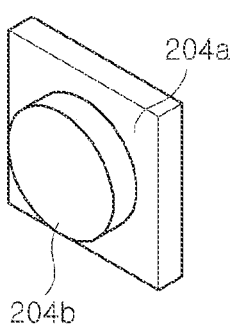
Figure 2C:
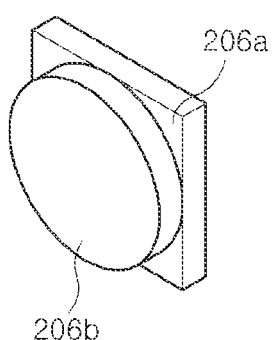
Figure 2D:
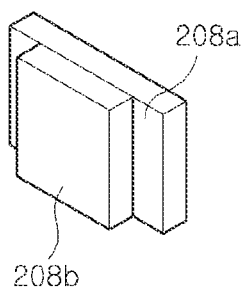
Figure 2E:
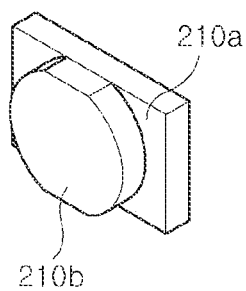
Figure 2F:
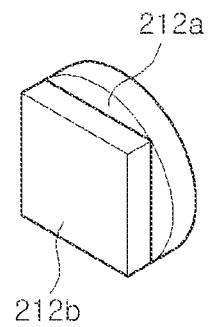

FIGS. 2A to 2F illustrate perspective views of land structures having various shapes that can be used with embodiments of the electronic package described in accordance with FIGS. 1A to 1G. FIG. 2A illustrates a land structure where both upper part 202a and lower part 202b have generally rectangular shapes. FIGS. 2B and 2C illustrate a land structure where upper parts 204a and 206a have generally rectangular shapes and lower parts 204b and 206b thereof have generally circular shapes. In FIG. 2C, side portions of lower part 206b are inset from upper part 206a and other sidewall portions of lower part 206b are flush with side portions of upper part 206a. FIG. 2D illustrates a land structure where both upper part 208a and lower part 208b have a generally rectangular shape with lower part 208b having side portions inset on only two sides of upper part 208a. FIG. 2E illustrates a land structure where upper part 210a has a generally rectangular shape, the lower part 210b thereof has a generally circular shape, and lower part 210b has side portions inset on only two sides of upper part 210a. FIG. 2F illustrates a land structure where upper part 212a has a generally circular shape and lower part 212b thereof has a generally rectangular shape with the four corners of lower part 212b being substantially flush with the side portions of upper part 212a. Adhesion pad 102a can be formed, for example, having the various shape combinations described above or other shapes.

Figure 3A:
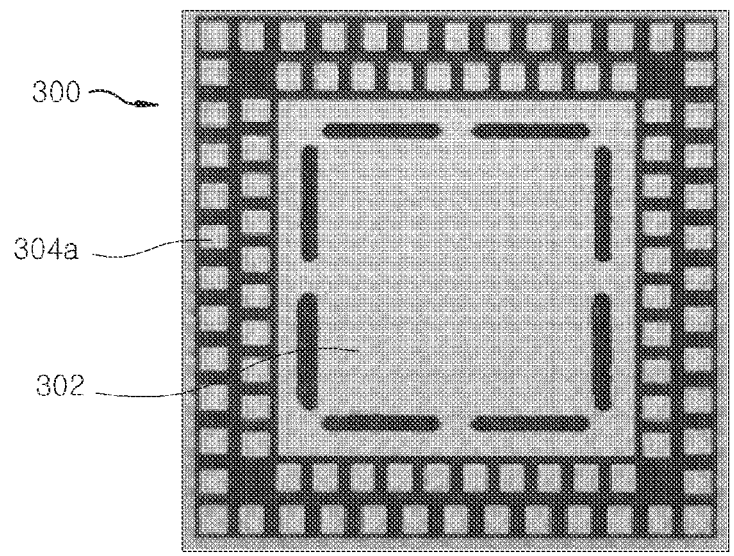
FIGS. 3A and 3B illustrate top and bottom views respectively of a portion of an electronic package in accordance with an embodiment of the present invention.
Figure 3B:
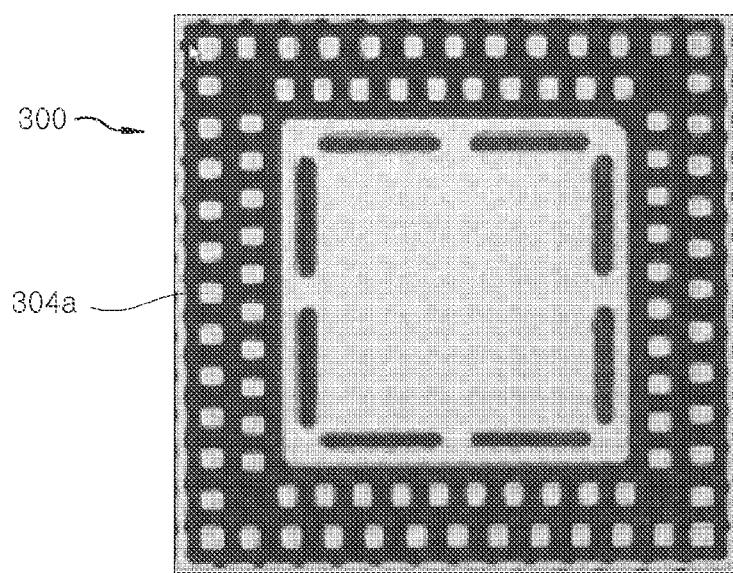

FIGS. 3A and 3B are top and bottom views respectively of a package substrate 300 illustrating a structure having a land structures configured having upper parts or portions that are relatively larger in size compared to the lower part thereof in accordance with one embodiment. As illustrated in FIGS. 3A and 3B, upper part 304a of the land structure has a generally rectangular shape and has a relatively larger size than the size of lower part 304b thereof. FIGS. 3A and 3B further illustrate an adhesion pad 302, which is configured for attaching an electronic die or semiconductor die thereto. Additionally, FIG. 3B illustrates the individual lands and adhesion pad 302 isolated from each other by a resin layer, such resin layer 104 illustrated in FIG. 1G.

Figure 1H:
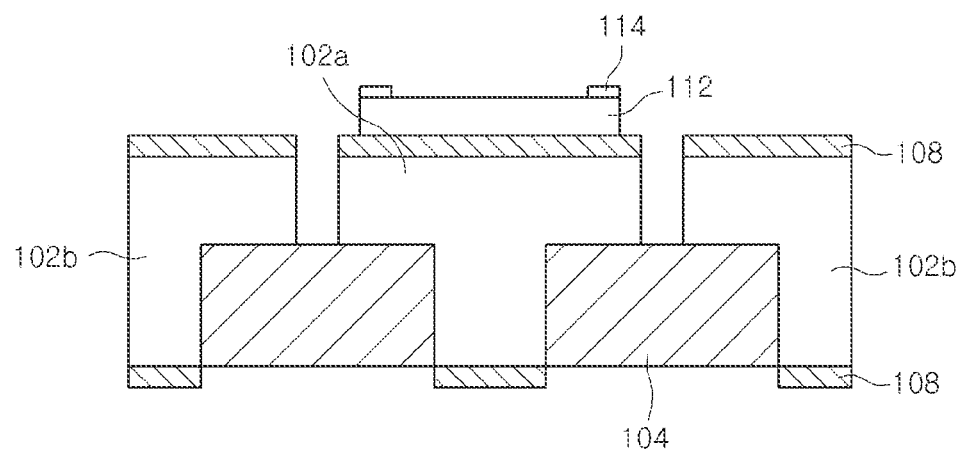
Figure 1I:
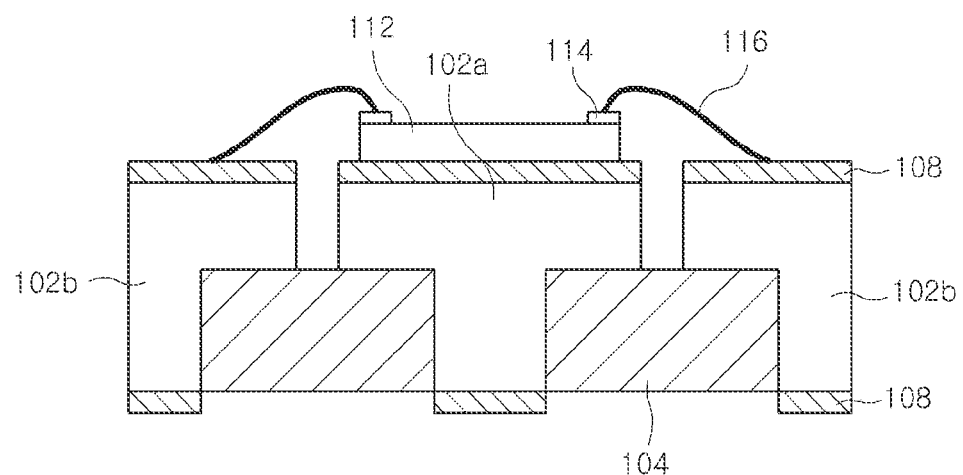

Referring now back to FIG. 1H, an adhesive or attachment layer (not shown), such as a solder paste, can be coated on or over the top surface of adhesion pad 102a. In one embodiment, a screen print method can be used to form the adhesive layer. Next, an electronic device or chip, such as a semiconductor die 112, is attached to adhesion pad 102a, and a bonding process is then performed, thereby connecting (electrically connecting) chip pads or bond pads 114 on semiconductor die 112 and the lands 102b using, for example, conductive wires 116. Accordingly, for example and as illustrated in FIG. 1I, electrical bonding or connection between semiconductor die 112 and lands 102b is facilitated.

Figure 1J:
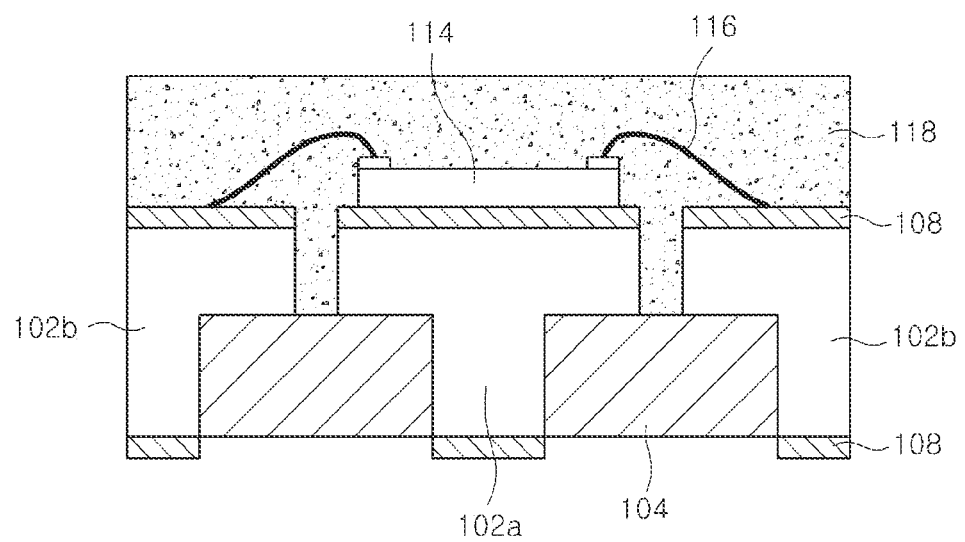

FIG. 1J illustrates the electronic package after further processing. For example, as illustrated in FIG. 1J, a molding member, mold body, or encapsulating layer 118 for protecting or encapsulating semiconductor die 112 and conductive wires 116 is formed by performing, for example a mold process to encapsulate (or mold) semiconductor die 112 and conductive wires 116 with a material (or molding member) such as a molding compound.

Figure 4:
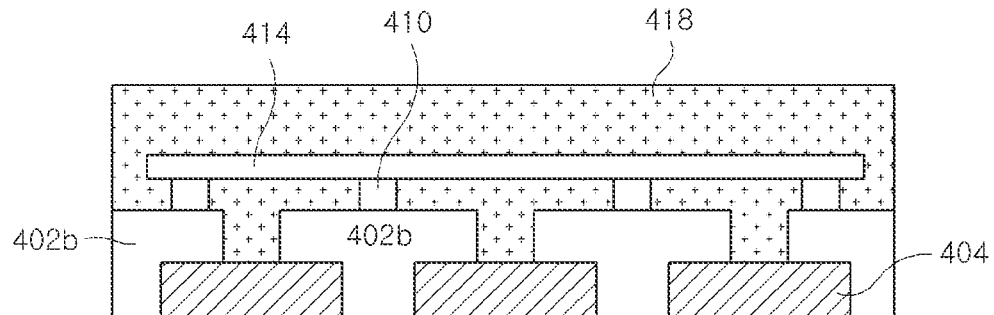
FIG. 4 illustrates a cross-sectional view of an electronic package manufactured in accordance with another embodiment of the present invention.

In the present embodiment, chip pads 114 on semiconductor die 112 and lands 102b have been illustrated as being coupled by conductive wires 116 and the conductive wires have been illustrated as being used as electrical connecting members between the semiconductor die and the lands, but the present embodiment is not necessarily limited thereto. For example, FIG. 4 illustrates a cross-sectional view of an electronic package manufactured in accordance with another embodiment. In FIG. 4, reference numeral 402b corresponds to 102b of FIG. 1J, reference numeral 414 corresponds to 112 of FIG. 1J, reference numeral 418 corresponds to 118 of FIG. 1J, and 402b, 414, and 418 can have the similar structures and materials as 102b, 112, and 118, respectively.

As illustrated in FIG. 4, semiconductor die 414 and lands 402b can be electrically (or physically) connected by connecting members (or conductive bumps) 410, such as solder balls or Kappa fillers. If semiconductor die 414 and lands 402b are interconnected by conductive bumps (or connecting members), such as solder balls or Kappa fillers, not by conductive wires, a MLF type substrate (for example, a combination of an adhesive pad, lands, and a resin layer) can be fabricated without performing processes related to plating in the electronic package of the present embodiment. Additionally, this embodiment can provide an electronic package with a smaller height or lower profile.

Figure 5:
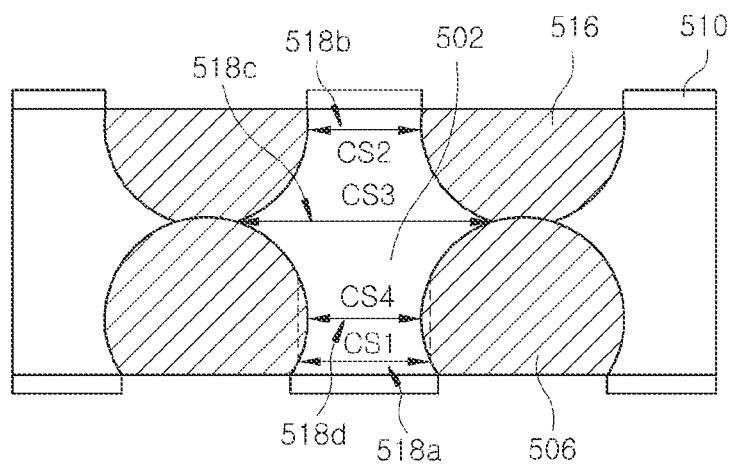
FIG. 5 illustrates a cross-sectional view of a land structure for an electronic package in accordance with an additional embodiment of the present invention.

FIG. 5 illustrates a cross-sectional view of a land structure for an electronic package, such as a semiconductor package, in accordance with another embodiment. In one embodiment, the land structures illustrated in FIG. 5 can be configured for connecting with the chip pads of an electronic device or chip (for example, a semiconductor device), which can be attached to an adhesion pad, through connecting members (for example, conductive wires, solder balls, or Kappa fillers). As illustrated in FIG. 5, a land 502 can be defined by or encapsulated by a first mold layer 506 configured to have a generally curved surface shape and a second mold layer 516 configured to have a generally curved surface shape and that can make contact with the first mold layer 506.

Land 502 is further defined by a cross-sectional area CS3 proximate to an internal part, a middle part, or a substantially centrally located part 518c of land 502 and is configured to be relatively larger than each of a cross-sectional area CS1 in a lower part 518a of land 502 and a cross-sectional area CS2 in an upper part 518b of land 502. In one embodiment, first mold layer 506 can be a pre-mold layer (for example, a pre-mold filled in a substrate fabrication process), and second mold layer 516 can be an epoxy mold compound ("EMC") mold layer. That is, first mold layer 506 and second mold layer 516 can be formed using different methods and/or different materials. Furthermore, the pre-mold layer is not limited to a pre-mold material, and various types of resins, such as epoxy or prepreg, can be used as the pre-mold layer.

In one embodiment, the shape of land 502 as described herein can be obtained by forming a first hole having curved surface form or shape on one side of a lead frame and forming a second hole in a curved surface form or shape on the opposite side of the lead frame. In one embodiment, the first hole and the second hole can be formed having curved surfaces by using a pressure difference (for example, fast etch rate versus slow etch rate) in the etchant coming in contact with respective portions of the lead frame during a half-etching process. In another embodiment, each of the first hole and the second hole can be formed having curved surfaces using a pressure difference and adjusting the etching time of the etchant that comes into contact with respective portions of the lead frame during a half-etching process. In one embodiment, the hole connected in a roundabout manner and having a curved surface shape can be formed using a half-etching process in such a way as to apply relatively strong etching pressure to the center of part of the lead frame corresponding to the hole and apply gradually weaker etching pressure to the sides around the center.

In one embodiment, surfaces lower part 518a, middle part 518c, and upper part 518b of land 502 that are generally perpendicular to the curved surfaces of the first and second holes can have a generally quadrangular shape (or a rectangular shape). In another embodiment, these parts can have a generally circular shape. In one embodiment, middle part 518c can have a relatively larger cross-sectional area than each of lower part 518a and upper part 518b, which provides a configuration that provides a locking structure or lock jaw that reduces the likelihood that land 502 will detach from the mold layers of the package substrate. Furthermore, a neck part 518d can be formed between the middle part 518c and the lower part 518a. In the present embodiment neck part 518d is configured to have a cross-sectional area CS4 that is relatively smaller than the cross-sectional area CS1 of lower part 518a. In one embodiment, neck part 518d can be formed using an etchant having a relatively greater etching diffusion property toward the sides of the holes than etching in a direction generally parallel to the sides thereof when performing the half-etching process. In the present embodiment, neck part 518d can function as an additional locking structure for reducing the likelihood that land 502 will detach from the molding layers of the package substrate. In FIG. 5, reference numeral 510 is illustrated as an optional plating layer. Plating layer 510 can be formed as a thin film on the bottom surface and/or the top surface of the land 502, and can comprise a solderable material.

Figure 6A:
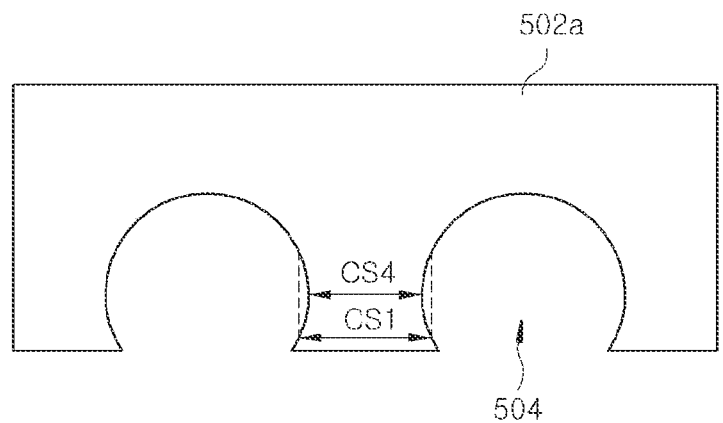
FIGS. 6A to 6F illustrate cross-sectional views of a land structure at various stages of fabrication in accordance with a further embodiment of the present invention.
Figure 6B:
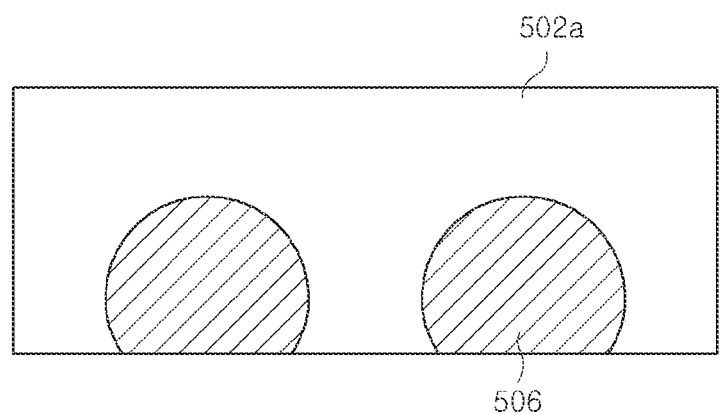

FIGS. 6A to 6F illustrate cross-sectional views of land structures at various stages of fabrication in accordance with one embodiment. The land structures are configured for use in an electronic package, such as an MLF type semiconductor package. Referring to FIG. 6A, first holes or cavities 504, which are configured to have a curved surface shape and to physically isolate lands to be formed through subsequent processes from each other, are formed by selectively removing part of or portions of one surface, such as the bottom surface, of a lead frame or substrate 502a through a half-etching process using photoresist patterns (not shown) as etch barrier layers. The lead frame 502a can be made of a conductive material, such as, copper (Cu), aluminum (Al), alloys thereof, plated materials, combinations thereof or other materials known to those of ordinary skill in the art.

In one embodiment, first holes or cavities 504 can be formed having a curved surface by using a pressure difference of an etchant that comes into contact with part of the bottom surface of lead frame 502a or a pressure difference and etching time of an etchant that comes into contact with part of the bottom surface of lead frame 502a. More particularly, first hole 504, which is connected in a roundabout manner in a curved surface form, can be formed using a half-etching process in such a way as to apply relatively strong etching pressure towards the center of part of the bottom of lead frame 502a in which first hole 504 will be formed and to apply gradually weaker etching pressure to the sides around the center.

In one embodiment, an etchant having a relatively greater lateral etching diffusion property toward the sides of the hole than etching vertical or inward when performing the half-etching process can be used such that the cross-sectional area CS4 of the neck part of the land is relatively smaller than the cross-sectional area CS1 of the lower part. In one embodiment, a combination or series of anisotropic and isotropic etchants can be used to form first hole 504.

Next, after removing (stripping) the remaining photoresist patterns, first hole 504 can be filled or over-filled with resin materials by performing a filling process, and the excess resin materials can then removed by performing a grinding process or another removal process. In one embodiment, the resin materials can overlap onto the surface of lead frame 502a adjoining first hole 504. In one embodiment, the resin materials are planarized until the bottom surface of lead frame 502a is exposed, thereby forming first mold layer 506 having the resin materials filled in first hole 504 as illustrated, for example, in FIG. 6B. In one embodiment, first mold layer 506 can be a pre-mold layer including materials described previously.

Figure 6C:
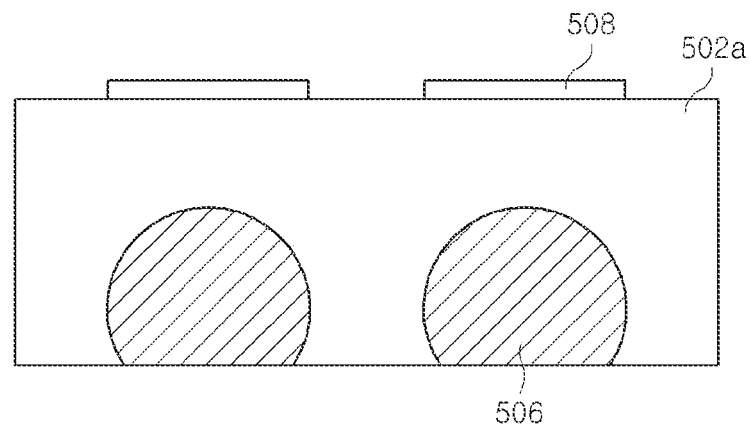

FIG. 6C illustrates the land structure after additional processing. For example, photoresist patterns 508 can be formed at desired or predetermined locations on the upper surface of lead frame 502a (that is, top regions on lead frame 502a, each pattern 508 for physically isolating the lands) by coating photoresist materials on lead frame 502a and then performing exposure and development processes.

Figure 6D:
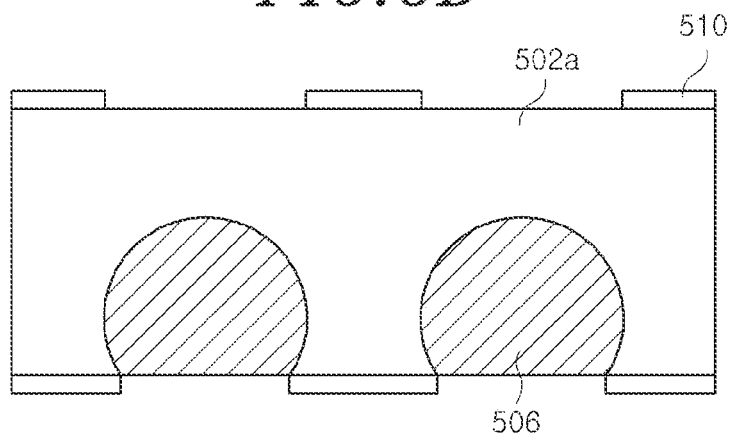

FIG. 6D illustrates the land structure after more processing. For example, optional plating materials can be selectively formed on the top and bottom of lead frame 502a by performing a plating process using photoresist patterns 508 formed on the lead frame 502a as plating-shield or protective layers. For example, as illustrated in FIG. 6D, plating layers 510 are formed on the top and bottom of lead frame 502a by removing (or stripping) the remaining photoresist patterns 508 before the plating process is done.

Figure 6E:
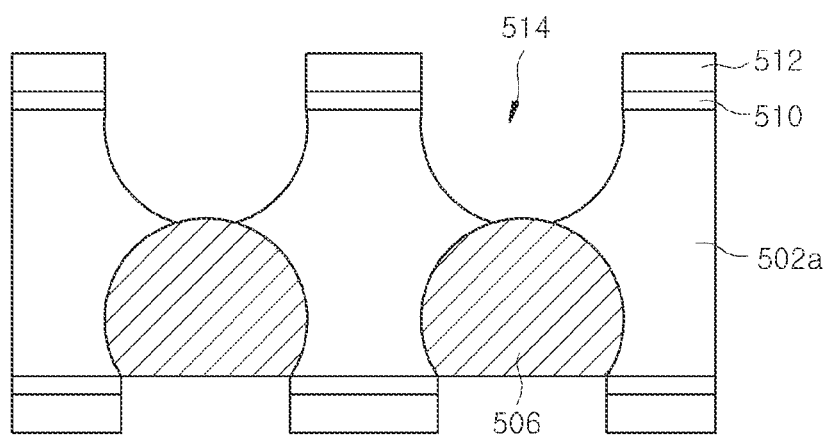
Figure 6F:
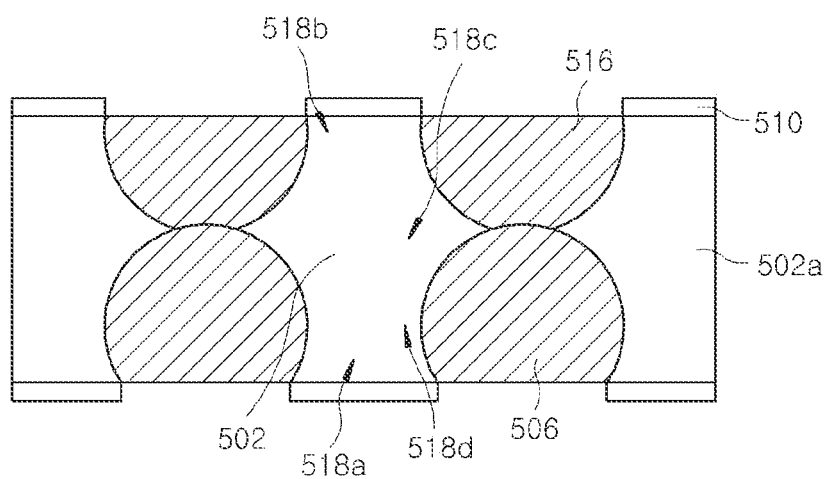

FIG. 6E illustrates the land structure after further processing. In one embodiment, photoresist patterns 512 can be formed on plating layers 510 by coating photoresist materials on lead frame 502a on which the plating layers 510 have been formed and then performing exposure and development processes. In the present embodiment, the top regions of lead frame 502a, each for physically isolating lands to be formed through subsequent processes from each other, are exposed through photoresist patterns 512.

As further illustrated in FIG. 6E, second holes 514, each configured to have a curved surface shape and to physically isolate lands to be formed through subsequent processes from each other, can be formed by selectively removing part of the top of lead frame 502a using a half-etching process with photoresist patterns 512 as etch barrier layers. In one embodiment, second holes or cavities 514 can be formed having a curved surface by using a pressure difference of an etchant that comes into contact with part of the top surface of lead frame 502a or a pressure difference and etching time of an etchant that comes into contact with part of the top surface of lead frame 502a. More particularly, second hole 514, which is connected in a roundabout manner in a curved surface form, can be formed using a half-etching process in such a way as to apply relatively strong etching pressure to the center of part of the top surface of lead frame 502a at which a hole will be formed and applying gradually weaker etching pressure toward the side around the center.

Next, after removing (stripping) the remaining photoresist patterns 512, second hole 514 can be filled or over-filled with resin materials by performing a filling process, and the excess resin materials can be removed by performing a grinding process or another removal process. In one embodiment, the resin materials are planarized until the top surface of lead frame 502a is exposed, thereby forming the second mold layer 516 having the resin materials filled in second holes 514 as illustrated, for example in FIG. 6F. Here, second mold layer 516 can be configured as an EMC mold layer.

In accordance with the present embodiment, land 502 is formed having internal part 518c that has a relatively greater cross-sectional area than both lower part 518a and upper part 518b. Furthermore, the present embodiment provides neck part 518d between internal part 518c and lower part 518a that has a relatively smaller cross-sectional area than lower part 518a.

In accordance with the present embodiment, the land structure for an electronic package can be manufactured in such a way as to form an internal part thereof having a relatively greater cross-sectional area than each of a lower part and an upper part. The internal part thereof is buried, covered or encapsulated with, for example, a pre-mold material. In a subsequent step, an electronic device, such as a semiconductor die, is attached to an adhesion pad within the lead frame and electrically connected to the land structure with connective devices. The semiconductor die and the connective devices are encapsulated with a molding member. In one embodiment, the pre-mold and the molding member may be different materials, and the connective device can be any one of a conductive wire, a solder ball, a Kappa filler, or combinations thereof. Accordingly, a land locking effect is obtained when fabricating an electronic package, such as an MLF type semiconductor package, even without changing the sizes of a land on the upper and lower parts.

In the present embodiment, the first mold layers (for example, layers 506) are formed and the plating layers are then formed on portions of the top and bottom surfaces of the lead frame by performing a plating process; however, the present embodiment is not necessarily limited thereto. The plating process for forming the plating layers may be omitted, if necessary, or it may be performed after second mold layers (for example, layers 516) are formed.

In accordance with another embodiment, the land structure of an electronic package, which is electrically connected with a chip pad of a semiconductor die adhered to an adhesion pad by means of a coupling member, is configured to have the size of the upper part of the land relatively larger than the size of the lower part thereof. Accordingly, a land locking effect is obtained when fabricating an electronic package, such as an MLF type semiconductor package.

From all of the foregoing, one skilled in the art can determine that, according to one embodiment a land structure for a semiconductor package comprises a land coupled with a chip pad of a semiconductor die, which is adhered to an adhesion pad, through a coupling member, wherein a size of an upper part of the land is relatively larger than a size of a lower part of the land.

In one embodiment of the foregoing structure, each of the upper part and the lower part of the land can have a rectangular structure. In another embodiment, each of the upper part and the lower part of the land can have a circular structure. In an additional embodiment, the upper part of the land can have a rectangular shape and the lower part of the land can have a circular shape. In a further embodiment, the upper part of the land can have a circular shape and the lower part of the land can have a rectangular shape.

From all of the foregoing, one skilled in the art can determine that, according to another embodiment a method for manufacturing a semiconductor package comprises forming an adhesion pad and lands, each having a size of an upper part relatively larger than a size of a lower part, in a lead frame, the adhesion pad and the land are physically isolated from each other by an insulating layer such as a resin layer. The method includes attaching a semiconductor die to the adhesion pad. The method includes electrically coupling chip pads of the semiconductor die and the lands. The method includes forming a molding member for burying the semiconductor die and conductive wires.

In one embodiment of the foregoing method, electrically coupling the chip pads and the lands can be performed using one of conductive wires, solder balls, or Kappa fillers. In another embodiment, forming the adhesion pad and the lands can comprise forming the insulating layer for defining the adhesion pad and the land in the lead frame; forming a plating layer through which a top region for separating the adhesion pad and the land is selectively exposed; and forming the adhesion pad and the land by removing the exposed top region using an etching process so that part of a top surface of the insulating layer is exposed. In a further embodiment, forming the insulating layer can comprise forming a cavity by selectively removing part of the lead frame using an etching process; filling the cavity with insulating materials; and uniformly removing the insulating materials using a grinding process so that a bottom region of the lead frame is exposed. In a still further embodiment, forming the plating layer can comprise forming a plating-shield layer in the top region; forming the plating layers on a top and bottom of the lead frame using a plating process; and removing remaining plating-shield layers. In additional embodiment, the plating-shield layer can be a photoresist pattern.

From all of the foregoing, one skilled in the art can determine that, according to an additional embodiment an electronic package can comprise an electronic die adhered to an adhesion pad. A land is physically isolated from the adhesion pad and configured to have a size of an upper part of the land relatively larger than a size of a lower part of the land. A coupling member electrically connects the electronic die and the land. A molding member encapsulates the electronic die and the coupling member.

In one embodiment of the foregoing package structure, each of the upper part and the lower part of the land can have a rectangular structure. In another embodiment, each of the upper part and the lower part of the land can have a circular structure. In an additional embodiment, the upper part of the land can have a rectangular shape and the lower part of the land can have a circular shape. In a further embodiment, the upper part of the land can have a circular shape and the lower part of the land can have a rectangular shape. In a still further embodiment, the coupling member can be one of a conductive wire, a solder ball, or a Kappa filler.

From all of the foregoing, one skilled in the art can determine that, according to a further embodiment an electronic package comprises an electronic die coupled to an adhesion pad. A land is proximate to the adhesion pad and has an internal part with a cross-sectional area larger than a cross-sectional area of each of a lower part and an upper part thereof, the land further having a part under the internal part encapsulated with a pre-mold. A coupling device electrically connects the electronic die to the land. A molding member covers the electronic die and the coupling device.

In one embodiment of the foregoing package structure, each of the lower part, the internal part, and the upper part of the land can have a circular shape. In another embodiment, the internal part functions as a locking jaw of the land. In an additional embodiment, each of the lower part and the internal part, and the upper part and the internal part can be connected in a curved surface form. In a further embodiment, the coupling device can be a conductive wire, a solder ball, or a Kappa filler.

From all of the foregoing, one skilled in the art can determine that, according to a still further embodiment a method of forming a package substrate comprises forming a first hole having a curved surface shape by selectively etching part of a first surface of a substrate. The method includes forming a first insulating layer in the first hole. The method includes forming a second hole of a curved surface by selectively etching part of a second surface of the substrate. The method includes forming a second insulating layer in the second hole.

In one embodiment of the foregoing method, forming the first hole can comprise forming the first hole using a pressure difference of an etchant that comes into contact with part of the lower part. In another embodiment, forming the first hole can comprise applying relatively strong etching pressure to a center of part of the lower part corresponding to the first hole and applying gradually weaker etching pressure to a side around the center. In an additional embodiment, forming the first hole can comprise forming the first hole using a pressure difference and etching time of an etchant that comes into contact with part of the lower part. In a further embodiment, forming the first hole can comprise using an etchant having a relatively great etching diffusion property to a side of the first hole. In a still further embodiment, forming the first insulating layer can comprise forming resin materials to cover the first hole and planarizing the first mold layer so that a surface of the substrate is exposed. In yet another embodiment, the planarizing step can be done with a grinding process. In another embodiment, forming the second hole can comprise forming the second hole using a pressure difference of an etchant that comes into contact with part of the top. In an additional embodiment, forming the second hole can comprise applying relatively strong etching pressure to a center of the top corresponding to the second hole and applying gradually weaker etching pressure toward a side around the center. In a further embodiment, forming the second hole can comprise forming the second hole using a pressure difference and etching time of an etchant that comes into contact with part of the top. In a still further embodiment, forming the second insulating material can comprise covering the second hole, wherein the method provides a land having a middle part whose cross-sectional area is relatively larger than a cross-sectional area of each of a lower part and a upper part by uniformly removing the second insulating so that a surface of the substrate is exposed.

In view of all the above, it is evident that a novel structure and method are disclosed. Included, among other features, is a land structure embedded within a resin or insulating layer. In one embodiment, the land structure has an upper part that is relatively larger than the size of the lower part. In another embodiment, an internal part of the land structure is relatively larger than both the upper and lower parts of the land structure. The land structures are configured to provide an improved locking feature and to further improve interconnect and assembly processes.

While the subject matter of the invention is described with specific preferred embodiments and example embodiments, the foregoing drawings and descriptions thereof depict only typical embodiments of the subject matter and are not, therefore, to be considered limiting of its scope. It is evident that many alternatives and variations will be apparent to those skilled in the art.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention and form different embodiments, as would be understood by those skilled in the art.

What is claimed is:

1. A semiconductor package comprising:
a substrate comprising:
   a first land comprising a first land section comprising a first height and a second land section comprising a second height that is different than the first height, wherein the first land section and the second land section meet at an internal part of the first land that defines a bottom portion of the second land section; and
   a first mold encapsulant disposed adjacent a first lateral portion of the first land section and disposed below the bottom portion of the second land section, wherein a first lateral end of the second land section is devoid of the first mold encapsulant;
a semiconductor device coupled to the substrate, wherein the semiconductor device comprises:
   a first side,
   a second side opposing the first side, and
   an outer perimeter, wherein:
      the semiconductor device is attached to the second land section; and
      the first lateral end of the second land section is inside the outer perimeter of the semiconductor device; and
a mold member encapsulating at least portions of the semiconductor device, wherein:
   the mold member and the first mold encapsulant comprise different materials;
   the mold member directly contacts and encapsulates the first lateral end of the second land section;
   the first land section comprises a first land section lower surface;
   the first land section has a first width proximate to the first land section lower surface in a first cross-sectional view;
   the second land section comprises a second land upper surface;
   the second land section has a second width proximate to the second land upper surface in the first cross-sectional view; and
   the second width is less than the first width.

2. The semiconductor package of claim 1, wherein:
the substrate comprises a plurality of lands each with a first land section and a second land section;
each of the second land section comprises opposing lateral ends;
each of the opposing lateral ends is devoid of the first mold encapsulant;
the mold member terminates without extending below the bottom portion of the second land section; and
the second height is less than the first height.

3. The semiconductor package of claim 1, wherein:
the mold member comprises a bottom side;
the first mold encapsulant comprises a top side; and
the top side of the first mold encapsulant adjoins the bottom side of the mold member at a location adjacent to the bottom portion of the second land section.

4. The semiconductor package of claim 1, wherein:
the first land section comprises a first narrowest dimension parallel to the first width in the first cross-sectional view;
the second land section comprises a second narrowest dimension parallel to the second width in the first cross-sectional view;
the first narrowest dimension is less than the second narrowest dimension;
the substrate comprises a second land having a second land wide portion and a second land narrow portion, the second land configured in a T-shape in a second cross-sectional view; and
the first mold encapsulant is disposed adjacent to the second land narrow portion.

5. The semiconductor package of claim 4, wherein:
the semiconductor device is attached to the second land section with a first conductive bump structure;
the semiconductor device is attached to the second land wide portion with a second conductive bump structure; and
the second land is entirely inside the outer perimeter of the semiconductor device.

6. The semiconductor package of claim 1, wherein:
the semiconductor device is attached to the second land section with a first conductive bump structure;
at least a portion of the first land section is disposed outside the outer perimeter of the semiconductor device;

the substrate comprises:
  a second land comprising a second land wide portion and a second land narrow portion; and
  a third land comprising a third land wide portion and third land narrow portion;
the second land comprises a T-shape in a second cross-sectional view;
the third land comprises a T-shape in the second cross-sectional view;
the first mold encapsulant is disposed adjacent to the second land narrow portion and adjacent to the third land narrow portion;
the semiconductor device is attached to the second land wide portion with a second conductive bump structure and attached to the third land wide portion with a third conductive bump;
the second land and the third land are entirely inside the outer perimeter of the semiconductor device; and
lateral edges of the second land wide portion and lateral edges of the third land wide portion are devoid of the first mold encapsulant.

7. The semiconductor package of claim 1, wherein:
the first land section and the second land section have similar shapes in a perspective view.

8. The semiconductor package of claim 1, wherein:
the first land section and the second land section have different shapes in a perspective view.

9. The semiconductor package of claim 1, wherein:
the first land section comprises a first land section lower surface;
the first land section has a first width proximate to the first land section lower surface in a first cross-sectional view;
the second land section comprises a second land upper surface;
the second land section has a second width proximate to the second land upper surface in the first cross-sectional view;
the second width is less than the first width;
the first land comprises a first land wide portion and a first land narrow portion configured to define the first land having a T-shape in a second cross-sectional view; and
the first mold encapsulant is disposed adjacent to the first land narrow portion.

10. A semiconductor package comprising:
a substrate comprising:
  a first land having a first land section comprising a first part proximate to a first surface of the substrate and extending to a second part internal to the first land, the first land comprising a second land section comprising a third part proximate to a second surface of the substrate and extending to the second part;
  a second land having a second land wide portion and second land narrow portion; and
  a first mold layer disposed adjacent to and directly contacting the first land section and the second land narrow portion,
wherein:
  the first land section has a first height;
  the second land section has a second height different than the first height;
  the first land section comprises a first width in a first cross-sectional view;
  the second land section comprises a second width in the first cross-sectional view; and
  the second part internal to the first land comprises a third width in the first cross-sectional view that is greater than the first width and the second width;
a semiconductor device coupled to the second land section and coupled to the second land wide portion, wherein:
  at least a portion of the first land section is disposed outside a perimeter of the semiconductor device in a second cross-sectional view;
  the first land section comprises a first narrowest dimension in the first cross-sectional view parallel to the first width;
  the second land section comprises a second narrowest dimension in the first cross-sectional view parallel to the second width; and
  the first narrowest dimension is less than the second narrowest dimension; and
a mold member encapsulating at least portions of the semiconductor device; wherein:
  the mold member comprises a bottom side;
  the first mold layer comprises a top side; and
  the top side of the first mold layer adjoins the bottom side of the mold member at location where the second land wide portion meets the second land narrow portion and the first land section meets the second land section.

11. The semiconductor package of claim 10, wherein:
the mold member and the first mold layer comprise different materials;
the second width is less than the first width; and
the mold member is disposed adjacent to a side surface of the second land section.

12. The semiconductor package of claim 10, further comprising:
a first conductive bump; and
a second conductive bump;
wherein:
  the semiconductor device is coupled to the second land section with the first conductive bump and coupled to the second land wide portion with the second conductive bump.

13. The semiconductor package of claim 10, wherein:
a first portion of the second land section is disposed within the perimeter of the semiconductor device in the second cross-sectional view; and
a second portion of the second land section is disposed outside of the perimeter of the semiconductor device in the second cross-sectional view.

14. The semiconductor package of claim 10, wherein:
the first land section and the second land section comprise a T-shape in the second cross-sectional view.

15. The semiconductor package of claim 10, wherein:
the first land section and the second land section have different shapes in a perspective view.

* * * * *